(12) United States Patent
Sorimachi et al.

(10) Patent No.: US 6,469,380 B2
(45) Date of Patent: Oct. 22, 2002

(54) RESIN SEALED SEMICONDUCTOR DEVICE UTILIZING A CLAD MATERIAL HEAT SINK

(75) Inventors: Kazuaki Sorimachi, Saitama (JP); Masayoshi Kikuchi, Toyko (JP)

(73) Assignee: Citizen Watch Co., Ltd., Tokyo (JP)

(*) Notice: Subject to any disclaimer, the term of this patent is extended or adjusted under 35 U.S.C. 154(b) by 0 days.

(21) Appl. No.: 09/985,391

(22) Filed: Nov. 2, 2001

(65) Prior Publication Data

US 2002/0084523 A1 Jul. 4, 2002

(30) Foreign Application Priority Data

Nov. 8, 2000 (JP) ........................................ 2000-340055

(51) Int. Cl.[7] .............................................. H01L 23/34
(52) U.S. Cl. ........................ 257/706; 257/713; 257/717; 257/720; 257/783; 257/784; 257/796; 361/704; 361/711; 361/718
(58) Field of Search ................................ 257/706, 707, 257/712, 713, 717, 720, 787, 782, 783, 784, 796; 361/702, 709, 711, 704, 718; 438/121, 122, 124

(56) References Cited

U.S. PATENT DOCUMENTS

| | | | | |
|---|---|---|---|---|
| 4,868,349 A | * | 9/1989 | Chia | 174/52.4 |
| 5,233,225 A | * | 8/1993 | Ishida et al. | 257/796 |
| 5,289,039 A | * | 2/1994 | Ishida et al. | 257/796 |
| 5,294,826 A | * | 3/1994 | Marcantonio et al. | 257/659 |
| 5,397,746 A | * | 3/1995 | Blish, II | 438/122 |
| 5,489,801 A | * | 2/1996 | Blish, II | 257/675 |
| 5,608,267 A | * | 3/1997 | Mahulikar et al. | 257/796 |
| 5,652,461 A | * | 7/1997 | Ootsuki et al. | 257/675 |
| 5,653,891 A | * | 8/1997 | Otsuki et al. | 216/11 |
| 5,892,278 A | * | 4/1999 | Horita et al. | 257/706 |
| 6,093,960 A | * | 7/2000 | Tao et al. | 257/706 |
| 6,104,093 A | * | 8/2000 | Caletka et al. | 257/778 |
| 6,229,702 B1 | * | 5/2001 | Tao et al. | 361/704 |
| 6,369,455 B1 | * | 4/2002 | Ho et al. | 257/796 |

FOREIGN PATENT DOCUMENTS

| | | | |
|---|---|---|---|
| JP | 1-201941 | | 8/1989 |
| JP | 10-56103 | * | 2/1998 |

* cited by examiner

Primary Examiner—David L. Talbott
Assistant Examiner—Alonzo Chambliss
(74) Attorney, Agent, or Firm—Kanesaka & Takeuchi (57) ABSTRACT

A resin sealed semiconductor device includes a heat radiation member fixed to a saling resin. The heat radiation member is formed of a clad material including a first metal having a coefficient of linear expansion close to that of the sealing resin, and a second metal laminated on the first metal and having good adhesive property to the sealing resin. Thus, the heat radiation member can satisfy all three conditions required for the heat radiation member at a satisfactory level, i.e., (1) heat conductivity being excellent, (2) a difference of a coefficient of linear expansion between the heat radiation member and a sealing resin being small, and (3) adhesive property to the sealing resin being good.

9 Claims, 7 Drawing Sheets

RESIN SEALED SEMICONDUCTOR DEVICE UTILIZING A CLAD MATERIAL HEAT SINK

BACKGROUND OF THE INVENTION

1. Field of the Invention

The present invention relates to the improvement of a heat radiation structure of a resin sealed semiconductor device, and particularly, it relates to a heat radiation structure of a semiconductor device which can satisfy three conditions required for a heat radiation member, i.e., (1) heat conductivity being excellent, (2) a difference of a coefficient of linear expansion between the heat radiation member and a sealing resin being small, and (3) adhesive properties to the sealing resin being good.

2. Description of the Related Art

A pin grid array (PGA) and a ball grid array (BGA) have generally been known as semiconductor devices in which high-density mounting is possible. Each of the PGA and BGA is a semiconductor device which is manufactured by mounting an IC chip on a resin substrate having a plurality of contact electrodes on an underside, and then sealing the IC chip on the substrate with a resin.

Moreover, in recent years, this type of PGA and BGA has been commercialized by sealing the IC chip mounted on the substrate with the resin by injection molding, and then integrally forming a metallic radiation member on an upper surface of the sealing resin to enhance a heat radiation effect of the IC chip.

Figure 7:
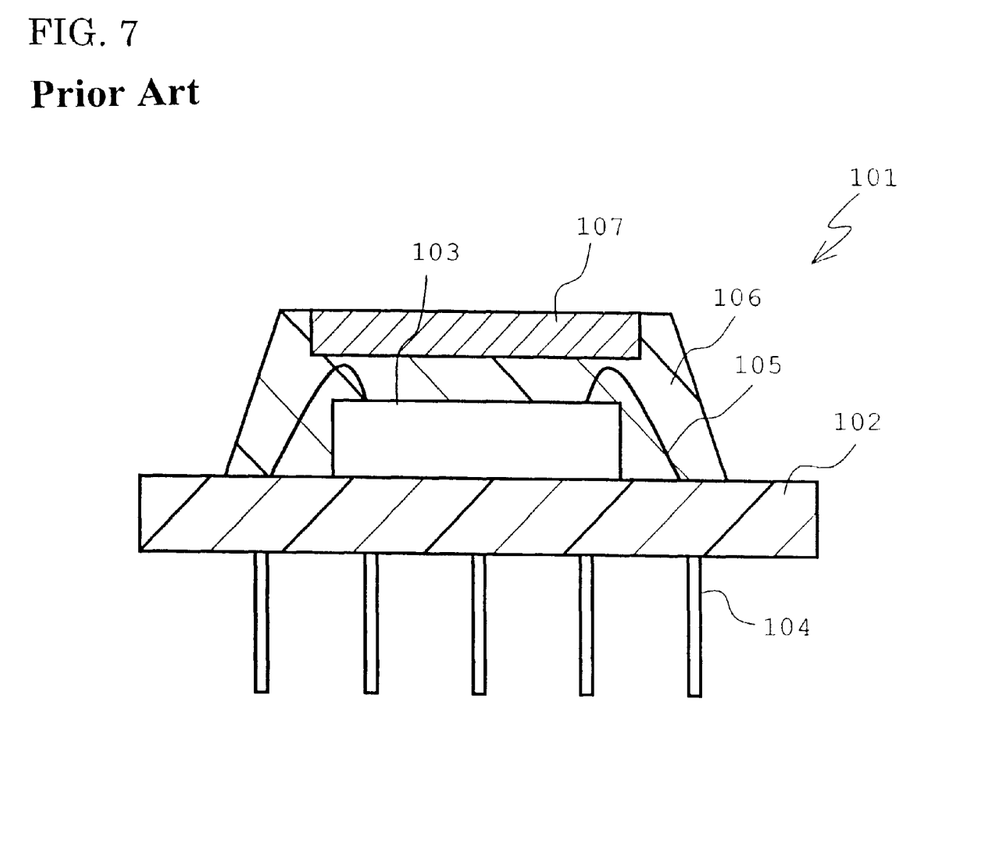
FIG. 7 is a sectional view showing a conventional resin sealed ball grid array.

The semiconductor device including the metallic heat radiation member integrally formed with the sealing resin is shown in FIG. 7.

A semiconductor device 101 shown in the drawing has a structure in which an IC chip 103 is mounted on a circuit substrate 102 made of a resin, the IC chip 103 and a bonding wire 105 are resin-sealed with a sealing resin 106 by injection molding, and a metallic heat radiation member 107 is integrally formed with the sealing resin above the IC chip 103.

A plurality of pins 104 which function as external connection terminals are disposed on an underside of the circuit substrate 102.

In this semiconductor device, when the IC chip 103 mounted on the circuit substrate 102 is sealed by the resin, the resin substrate 102 with the IC chip 103 mounted thereon is held by a lower mold member of a molding mold, and the heat radiation member 107 is held by an upper mold member. In this state, an injection molding resin is injected through an injection port, whereby the metallic heat radiation member 107 can integrally be formed on the upper surface of the sealing resin 106.

However, as a result of subsequent intensive researches, the present applicant has found that, in the constitution in which the metallic heat radiation member is integrally formed on the upper surface of the sealing resin by injection molding, there must be considered the peeling of the sealing resin and the heat radiation member based on a difference of a coefficient of linear expansion between the injection molded resin and the heat radiation member.

That is, in the case that the difference of the coefficient of linear expansion between the injection molded resin and the heat radiation member is excessively large, and when the IC chip generates heat, a warp force is generated between the resin and the member, so that thermal peeling occurs sometimes between the sealing resin and the heat radiation member. Furthermore, considering conditions required for the heat radiation member including the occurrence of the thermal peeling, it has been found that the heat radiation member needs to satisfy three conditions, i.e., (1) the heat conductivity being excellent, (2) the difference of the coefficient of linear expansion between the heat radiation member and the sealing resin being small, and (3) adhesive properties to the sealing resin being good.

However, any single metal material cannot satisfy all the three conditions at a satisfactory level. In the actual situation, the heat radiation member is to be selected sacrificing any of the three conditions.

SUMMARY OF THE INVENTION

According to the present invention, there is provided a semiconductor device in which an IC chip mounted on a circuit substrate is sealed with a resin by injection molding, and a metallic heat radiation member is integrally formed on an upper surface of a sealing resin by the injection molding. The heat radiation member is constituted of a clad material in which different metals are combined.

Particularly, the heat radiation member is constituted of the clad material comprising a combination of a first metal having a coefficient of linear expansion close to that of the sealing resin, and a second metal having satisfactory adhesive properties to the sealing resin. Concretely, the first metal of the heat radiation member is preferably copper, and the second metal is aluminum.

Furthermore, the heat radiation member may comprise a three-layer structure in which the second metal is laminated on opposite surfaces of the first metal.

As described above, in the resin sealed semiconductor device of the present invention, the heat radiation member is constituted as the clad material in which the first metal having a coefficient of linear expansion close to that of the sealing resin is used as a core material, and the second metal having satisfactory adhesive properties to the sealing resin is laminated on the surfaces of the first metal.

Therefore, there can be obtained the metallic heat radiation member, which can satisfy three conditions required for the heat radiation member at a satisfactory level, i.e., (1) heat conductivity being excellent, (2) the difference of the coefficient of linear expansion between the heat radiation member and the sealing resin being small, and (3) adhesive properties to the sealing resin being good.

Moreover, according to the present invention, there can be provided the heat radiation member in which the first and second metals can arbitrarily be selected, and which is suitable for respective sealing resins different from one another in properties.

Furthermore, in the present invention, since the heat radiation member is constituted as the clad material, the heat radiation member having arbitrary properties can be obtained without increasing a processing cost.

BRIEF DESCRIPTION OF THE DRAWINGS

FIGS. 2A and 2B are sectional views of a metallic heat radiation member according to the first embodiment of the present invention, wherein FIG. 2A shows a three metal layer structure, and FIG. 2B shows a two metal layer structure.

BEST MODE OF CARRYING OUT THE INVENTION

Preferred embodiments of the present invention will be described hereinafter with reference to FIGS. 1 to 6.

[First Embodiment]

Figure 1A:
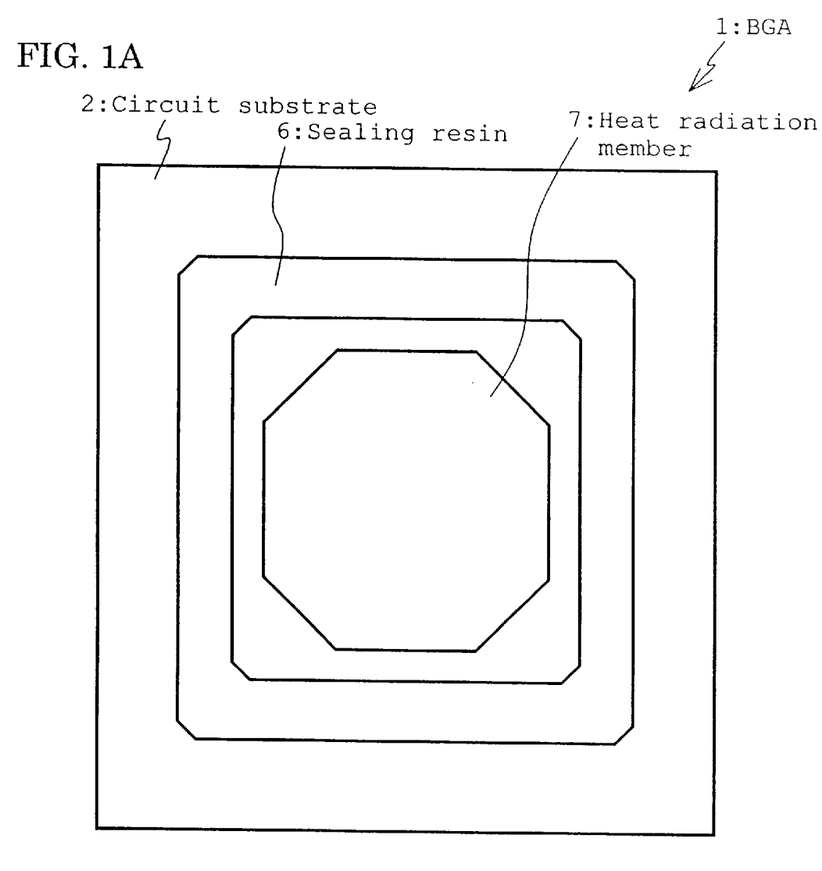
FIG. 1A is a plan view of a resin sealed ball grid array according to a first embodiment of the present invention.
Figure 1B:
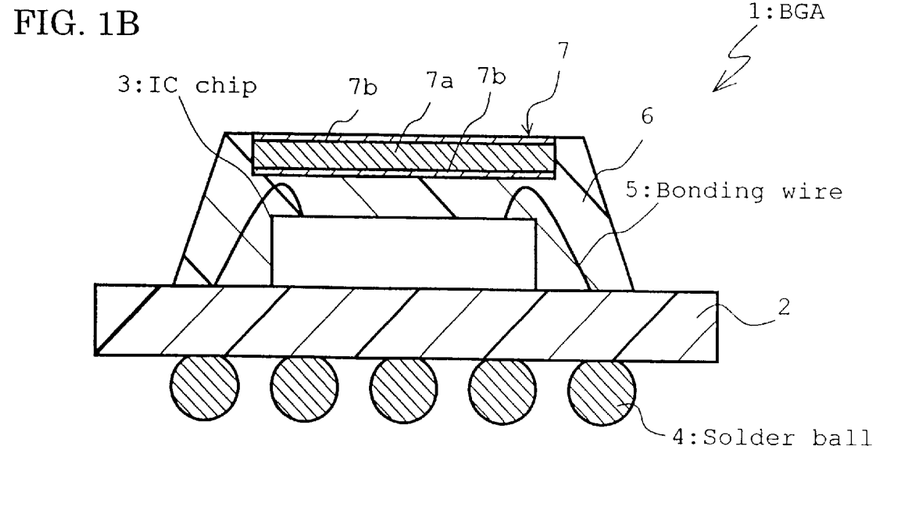
FIG. 1B is a sectional view thereof.

FIGS. 1A and 1B show a first embodiment of the present invention, wherein FIG. 1A is a plan view of a resin sealed ball grid array (hereinafter abbreviated as BGA), and FIG. 1B is a sectional view thereof.

As shown in the drawings, a BGA 1 is a semiconductor device comprising a resin circuit substrate 2, an IC chip 3, and solder balls 4 as contact electrodes, and the IC chip 3 is mounted on an upper surface of the circuit substrate 2, and is connected to upper-surface electrodes (not shown) of the circuit substrate 2 via bonding wires 5.

The upper-surface electrodes are connected to a plurality of solder balls 4 disposed on an underside of the substrate via through hole electrodes (not shown) formed on the circuit substrate 2.

The IC chip 3 mounted on the circuit substrate 2 is resin-sealed by a sealing resin 6, and a metallic heat radiation member 7 is disposed above the IC chip 3. Then, the chip and the member are integrally fixed by the sealing resin 6.

Additionally, the sealing resin 6 is mixed with a pigment of a black color in order to shade the IC chip 3.

The heat radiation member 7 is integrally formed by an insert mold during injection molding of the sealing resin 6 for sealing the IC chip 3.

Figure 2A:
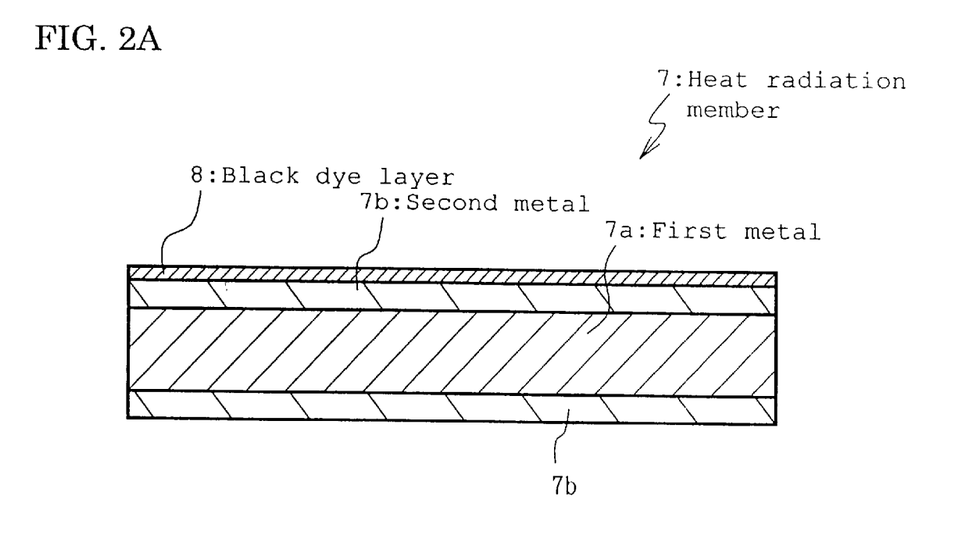
Figure 2B:
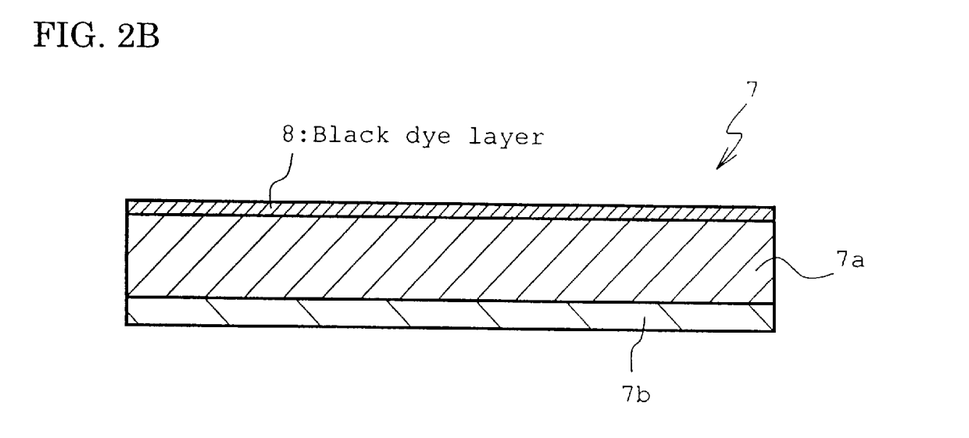

Moreover, as shown in FIGS. 1B, 2A and 2B, the heat radiation member 7 of the present embodiment is constituted of a clad material comprising a combination of different metals including a first metal 7a and a second metal 7b.

The first metal 7a comprises a metal having a satisfactory heat conductivity and a coefficient of linear expansion close to that of the sealing resin 6. The second metal 7b comprises a metal having the heat conductivity and the coefficient of linear expansion not as good as those of the first metal 7a but having satisfactory adhesive properties to the sealing resin 6 because the surface thereof is oxidized in air and an oxide film is formed at a slow speed.

Moreover, in the present embodiment, as shown in FIGS. 2A and 2B, a black dye layer 8 forming a color layer having the same color as that of the sealing resin 6 formed in the black color is formed on the upper surface of the heat radiation member 7. Since the color layer having the same color as that of the sealing resin 6 is formed on the upper surface of the heat radiation member 7 in this manner, even when the heat radiation member 7 has a slight position deviation from a middle of the upper surface of the sealing resin 6 during the injection molding, the position deviation can be inconspicuous.

In a heat radiation operation of the BGA 1, similarly as the BGA having a conventional structure, heat generated by the IC chip 3 is radiated upwards via the sealing resin 6 and the heat radiation member 7, and then, the sealing resin 6 and the heat radiation member 7 are expanded with a rise of temperature during the heat radiation.

In this case, when the coefficients of linear expansion of the resin and the member are close to each other, the sealing resin 6 and the heat radiation member 7 contract/expand at the same ratio and any problem does not arise. However, when a difference between the coefficients of linear expansion is excessively large, a warp force is generated between the sealing resin 6 and the heat radiation member 7 during heat generation of the IC chip 3. This causes thermal peeling between the resin and the member.

To solve the problem, in the present embodiment, the clad material comprising the first metal 7a and the second metal 7b is used as the heat radiation member 7, whereby the above thermal peeling can be prevented. That is, the heat radiation member 7 of the present embodiment is constituted of the clad material, which can be prepared by laminating the second metal 7b on upper and lower surfaces of the first metal 7a as a core material. The above first metal 7a has a satisfactory heat conductivity and a coefficient of linear expansion close to that of the sealing resin 6 and is formed into a thick plate shape, and the above second metal 7b has satisfactory adhesive properties to the sealing resin 6 due to a low formation speed of the oxide film and is formed into a thin plate.

According to this constitution, for the heat radiation member 7, properties of the heat radiation member are substantially determined by the thick-plate first metal 7a, and only the adhesive properties to the sealing resin 6 is determined by the second metal 7b.

Therefore, in the heat radiation member 7 of the present embodiment, a function of the heat radiation member can be shared by the first metal 7a and the second metal 7b. There can be obtained the metal heat radiation member which can satisfy three conditions required for the heat radiation member of the IC chip 3 at a satisfactory level, i.e., (1) heat conductivity being excellent, (2) a difference of a coefficient of linear expansion between the heat radiation member and a sealing resin being small, and (3) adhesive properties to the sealing resin being good.

TABLE 1

| Material | Heat conductivity K | Linear expansion coefficient α | K satisfactoriness | α satisfactoriness | Goodness of adhesive properties |
|---|---|---|---|---|---|
| Al | 190 | 23 | ◯ | Δ | ⊚ |
| Cu | 330 | 17 | ⊚ | ◯ | X |
| Brass | 90 | 19 | ◯ | ◯ | X |
| Au | 260 | 14 | ◯ | ⊚ | X |
| Ag | 360 | 19 | ⊚ | ◯ | ◯ |
| Fe | 61 | 12 | X | ⊚ | Δ |
| Sealing resin | | 10 to 14 | | | |

Table 1 shows respective properties of metal materials constituting the heat radiation member 7, shows a heat conductivity K (Kcal/mh° C.), coefficient of linear expansion α ($\times 10^{-6}$), satisfactoriness regarding the heat conductivity K (K satisfactoriness), satisfactoriness regarding the coefficient of linear expansion α (α satisfactoriness), and goodness of adhesive properties to the sealing resin, and further shows the coefficient of linear expansion of the sealing resin 6 for reference. Moreover, for symbols in the table, ⊚, ◯, Δ, X are shown in order from a good satisfactoriness.

As shown in Table 1, examples of the material with a rank ⊚ of satisfactoriness of heat conductivity K include Cu and Ag. Moreover, Cu, Ag are also in a rank of ○ of satisfactoriness of coefficient of linear expansion α. It is therefore seen that the materials are suitable for the first metal 7a as the core material of the heat radiation member 7.

Moreover, for the goodness of adhesive properties to the sealing resin 6, Al is in a rank of ⊚, and Ag is in a rank of ○. Therefore, it is seen that these materials are suitable for the second metal 7b.

On the other hand, as shown in Table 1, for Au and Fe, the satisfactoriness of coefficient of linear expansion α is in a rank of ⊚, but Au is expensive, and does not have adhesive properties to the sealing resin 6 because the oxide film is not formed on the surface. Moreover, Fe is excessively bad in the heat conductivity K. Therefore, either one of these materials is not suitable for the material of the heat radiation member 7.

TABLE 2

| Clad Material | K satisfactoriness | α satisfactoriness | Goodness of adhesive Properties | Clad adequacy | Cost |
|---|---|---|---|---|---|
| Cu—Al | ⊚ | ○ | ○ | ⊚ | ⊚ |
| Cu—Ag | ⊚ | ○ | Δ | ○ | Δ |
| Ag—Al | ⊚ | ○ | ○ | X | X |

Table 2 shows properties of the clad material obtained by combining the respective materials suitable for the heat radiation member 7 in accordance with results shown in Table 1, and shows three sets of Cu—Al, Cu—Ag, Ag—Al as combinations usable as the clad materials.

As shown in Table 2, any one of combinations of three sets can be employed in three respects: the satisfactoriness regarding the heat conductivity K (K satisfactoriness); satisfactoriness regarding the coefficient of linear expansion α; and goodness of adhesive properties to the sealing resin.

However, among the three sets, Ag—Al is difficult to employ in respect of clad adequacy and cost. As a result, it is seen that the combination of Cu—Al or Cu—Ag is suitable as the clad material.

It is therefore seen that Cu is optimum as the first metal 7a, and accordingly the clad material obtained by combining Cu with Al or Ag as the second metal 7b is suitable.

Furthermore, for these two sets, Cu—Ag is disadvantageous in respect of the cost because expensive Ag is used in even the thin-plate second metal 7b. Also considering from the adhesive properties to the sealing resin 6, the clad material of Cu—Al is most suitable for the heat radiation member 7.

Here, a case in which the clad material of Cu—Al is used as the heat radiation member 7 will concretely be described. As shown in Table 1, for the heat conductivity K, the surface of Cu having a conductivity of "330" is coated with thin Al of "190", but the heat conductivity of Cu large in volume dominantly acts, and sufficient heat radiation can be realized. Moreover, also for the coefficient of linear expansion α, since Cu of "17" is dominant with respect to Al of "23", the coefficient of linear expansion α of the whole clad material has a value close to the coefficient of linear expansion of "17" of Cu, and a difference from the coefficient of linear expansion of "14" of the sealing resin 6 is in an allowable range. Thereby, a problem of occurrence of thermal peeling between the sealing resin 6 and the heat radiation member 7 can be solved.

FIG. 2A is a sectional view of the heat radiation member 7 according to the present embodiment. The shown heat radiation member 7 has a three layer structure in which the second metal 7b is laminated on both the upper and lower surfaces of the first metal 7a as the core material. In this example, 210 to 130 μm thick Cu is used as the first metal 7a, 20 to 60 μm thick Al is used as the second metal 7b, and the heat radiation member 7 is constituted as a clad material having a thickness of 230 μm.

Moreover, the black dye layer 8 is formed on the surface of the second metal 7b on the upper surface of the heat radiation member 7 as described above, and even the position deviation of the heat radiation member 7 during the injection molding is inconspicuous.

On the other hand, FIG. 2B is a sectional view showing another example of the heat radiation member 7. In this example, different from FIG. 2A, the heat radiation member 7 has a two layer structure in which the second metal 7b is laminated only on the underside of the first metal 7a in contact with the sealing resin 6.

Moreover, the black dye layer 8 is directly formed on the upper surface of the first metal 7a.

Additionally, when the black dye layer 8 is formed on the surface of the heat radiation member 7 in this manner, a part of the black dye layer 8 is removed in a shape of a character or a numeral by laser, or the like, and a print marking can thus be formed.

As described above, in the resin sealed semiconductor device according to the present embodiment, the heat radiation member 7 is constituted of the clad material comprising the first metal 7a having a coefficient of linear expansion close to that of the sealing resin 6, and the second metal 7b which is laminated on the surfaces of the first metal 7a and which has satisfactory adhesive properties to the sealing resin 6.

There can be obtained the metallic heat radiation member which can satisfy three conditions required for the heat radiation member at a satisfactory level, i.e., (1) heat conductivity being excellent, (2) a difference of a coefficient of linear expansion between the heat radiation member and a sealing resin being small, and (3) adhesive properties to the sealing resin being good.

Moreover, when the first metal 7a and the second metal 7b are arbitrarily selected, there can be provided the heat radiation member 7 suitable for the respective sealing resins different from one another in properties.

Incidentally, since the heat radiation member 7 is constituted as the clad material, the heat radiation member having arbitrary properties can be obtained without increasing any processing cost.

Additionally, in the present embodiment, an example in which the semiconductor device constitutes the BGA has been described, but the present invention can also be applied to an example in which the semiconductor device constitutes a pin grid array (PGA).

That is, the present invention can be applied to any structure of the semiconductor device as long as the heat radiation member is integrally formed on the sealing resin for sealing the IC chip.

[Second Embodiment]

Figure 3A:
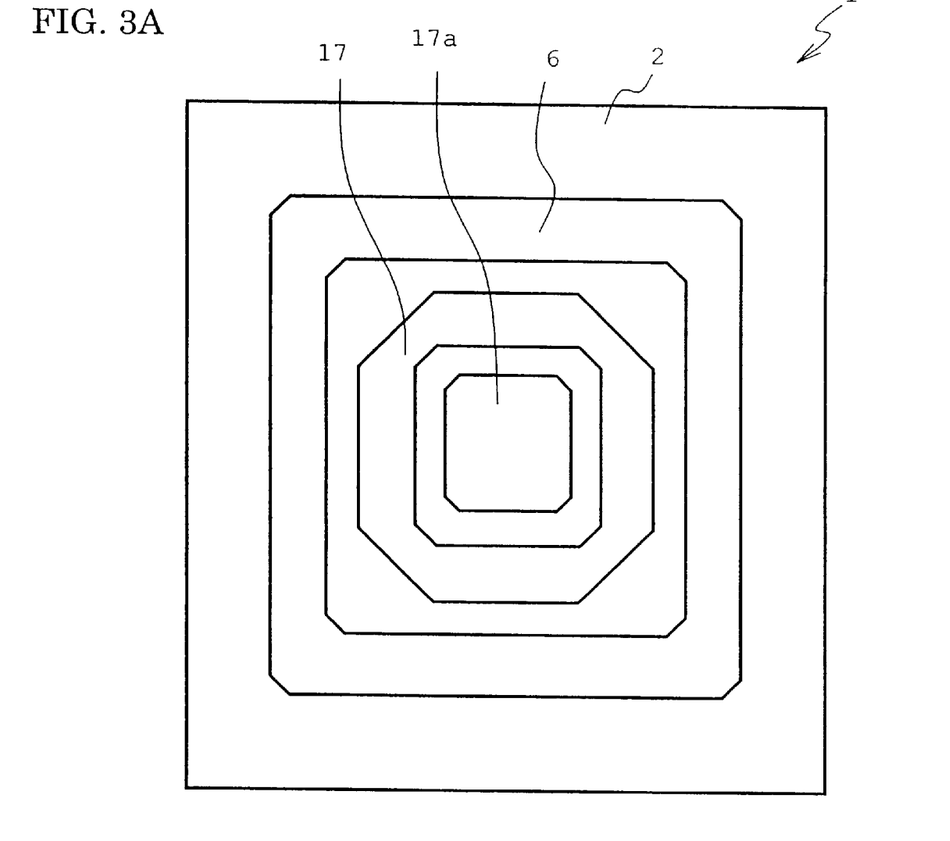
FIG. 3A is a plan view of the resin sealed ball grid array according to a second embodiment of the present invention.
Figure 3B:
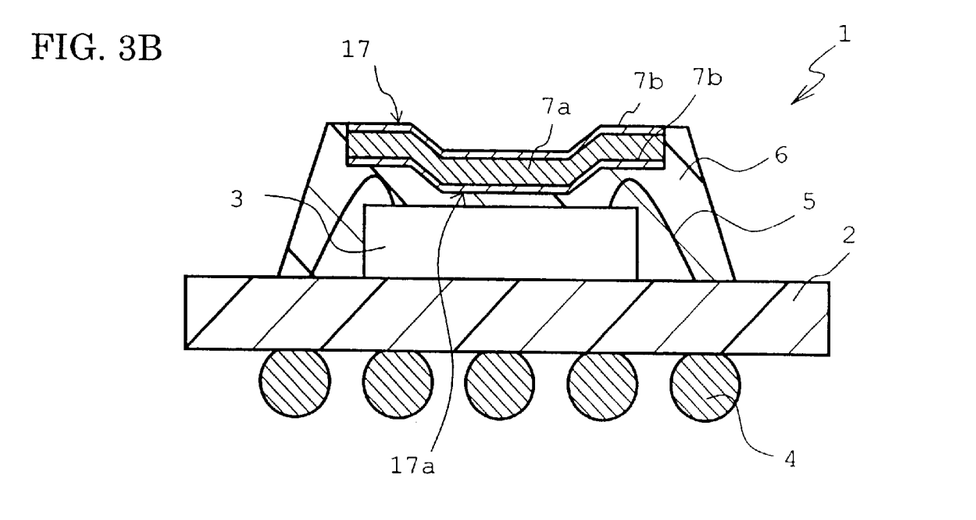
FIG. 3B is a sectional view thereof.

FIGS. 3A and 3B show a second embodiment of the present invention, wherein FIG. 3A is a plan view of the BGA 1, and FIG. 3B is a sectional view thereof. In the drawings, parts similar to those of FIGS. 1A and 1B are denoted with the same reference numeral and detailed description thereof is omitted.

In the present embodiment shown in FIGS. 3A and 3B, similarly as first embodiment, a heat radiation member 17 is constituted of the clad material comprising the first metal 7a and the second metal 7b, and a protrusion 17a projecting on an IC chip 3 side is formed in a middle portion of the heat radiation member 17.

Since the protrusion 17a is formed on the heat radiation member 17, as shown in FIG. 3B, a distance between the IC chip 3 and the heat radiation member 17 can be reduced, the heat generated by the IC chip 3 can easily be conducted to the heat radiation member 17, and a heat radiation effect can further be enhanced.

Moreover, since the protrusion 17a projects on the IC chip 3 side, the adhesive properties between the sealing resin 6 and the heat radiation member 17 can also be enhanced.

[Third Embodiment]

Figure 4A:
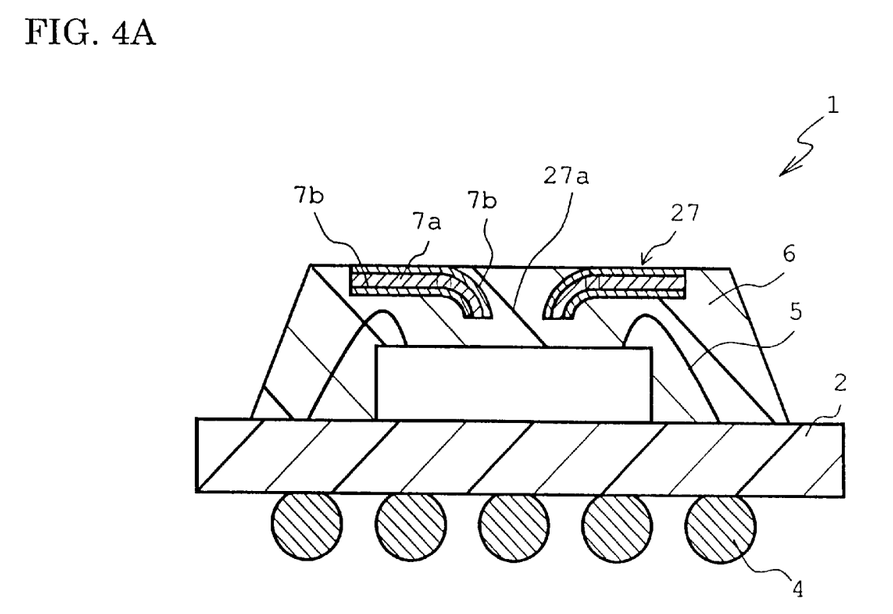
FIG. 4A is a sectional view of the resin sealed ball grid array according to a third embodiment of the present invention.
Figure 4B:
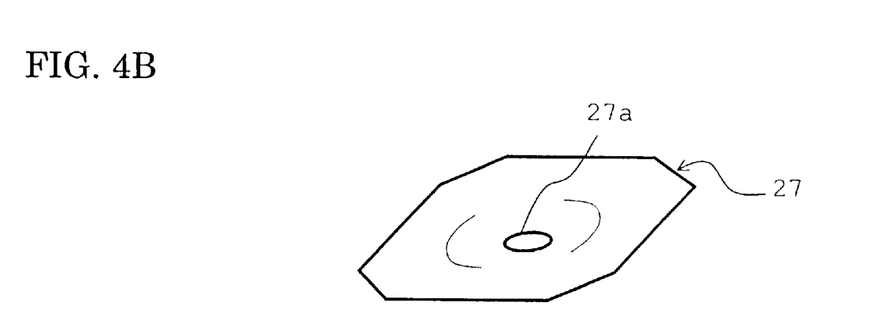
FIG. 4B is a schematic perspective view of the heat radiation member.

FIGS. 4A and 4B show a third embodiment of the present invention, wherein FIG. 4A is a sectional view of the BGA 1, and FIG. 4B is a perspective view of the heat radiation member. Incidentally, also in the drawings, the parts similar to those of FIGS. 1A and 1B are denoted with the same reference numerals and the detailed description thereof is omitted.

In the embodiment shown in FIGS. 4A and 4B, a through hole 27a projecting in a funnel shape on the IC chip 3 side is formed in the middle portion of a heat radiation member 27 comprising the first metal 7a and the second metal 7b.

In the embodiment shown in FIG. 4, a through hole 27a projecting in a funnel shape on the IC chip 3 side is formed in the middle portion of a heat radiation member 27 comprising the first metal 7a and the second metal 7b.

Since the through hole 27a is formed in the heat radiation member 27 in this manner, the resin can also be injected into the projecting through hole 27a during the injection molding of the sealing resin 6 (see FIG. 4A). Therefore, the distance from the IC chip 3 can be reduced, the heat radiation effect can be enhanced, and further an adhesive force between the heat radiation member 27 and the sealing resin 6 can be increased.

[Fourth Embodiment]

Figure 5A:
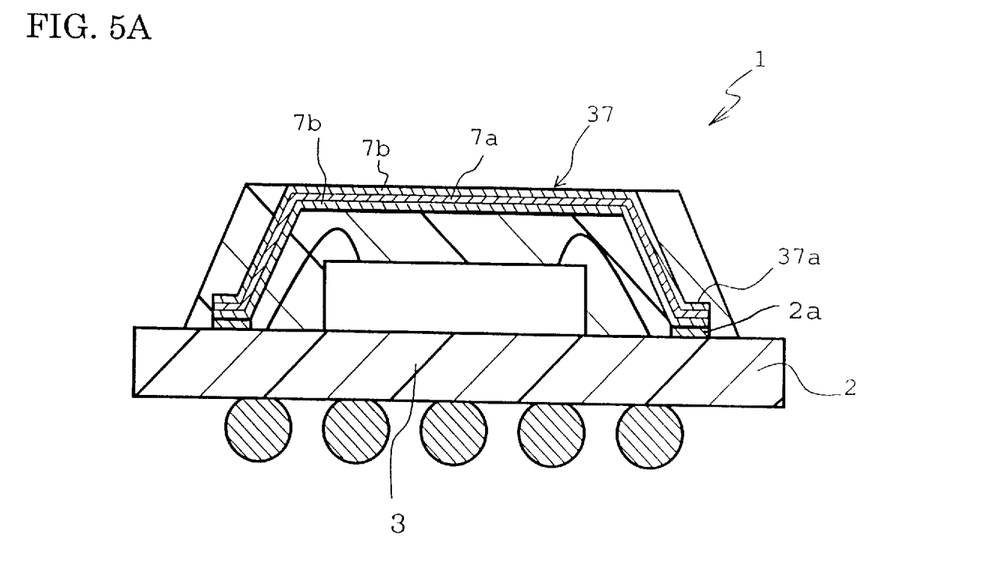
FIG. 5A is a sectional view of the resin sealed ball grid array according to a fourth embodiment of the present invention.
Figure 5B:
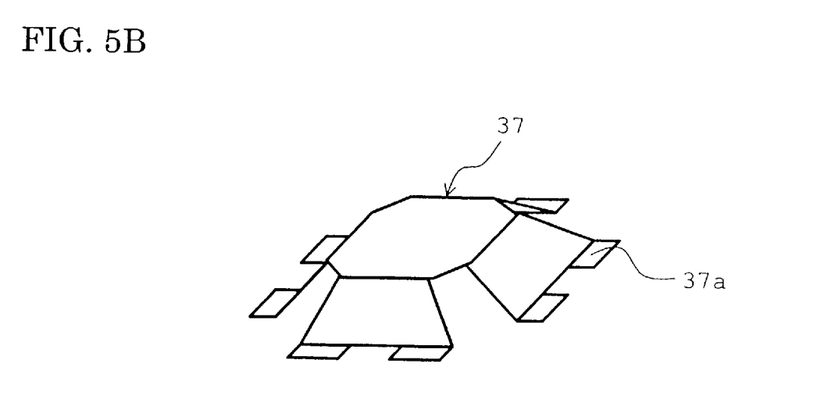
FIG. 5B is a schematic perspective view of the heat radiation member.

FIGS. 5A and 5B show a fourth embodiment of the present invention, wherein FIG. 5A is a sectional view of the BGA 1, and FIG. 5B is a perspective view of the heat radiation member. Incidentally, also in the drawings, the parts similar to those of FIGS. 1A and 1B ar denoted with the same reference numerals and the detailed description thereof is omitted.

In the embodiment shown in FIGS. 5A and 5B, a heat radiation member 37 comprising the first metal 7a and the second metal 7b is formed substantially in a lid shape in which leg portions 37a having four sides extending toward the circuit substrate 2 is formed. A tip end of the leg portion 37a of the heat radiation member 37 is bent/formed in a shape which can contact a ground (earth) electrode formed on the upper surface of the circuit substrate 2.

Moreover, as shown in FIG. 5A, the heat radiation member 37 is connected to a ground electrode 2a on the circuit substrate 2.

Since the heat radiation member 37 is brought in contact with the ground electrode of the circuit substrate 2 in this manner, the adhesive force between the heat radiation member 37 and the sealing resin 6 can be increased, besides, a shield effect with respect to the IC chip 3 can be imparted.

[Fifth Embodiment]

Figure 6A:
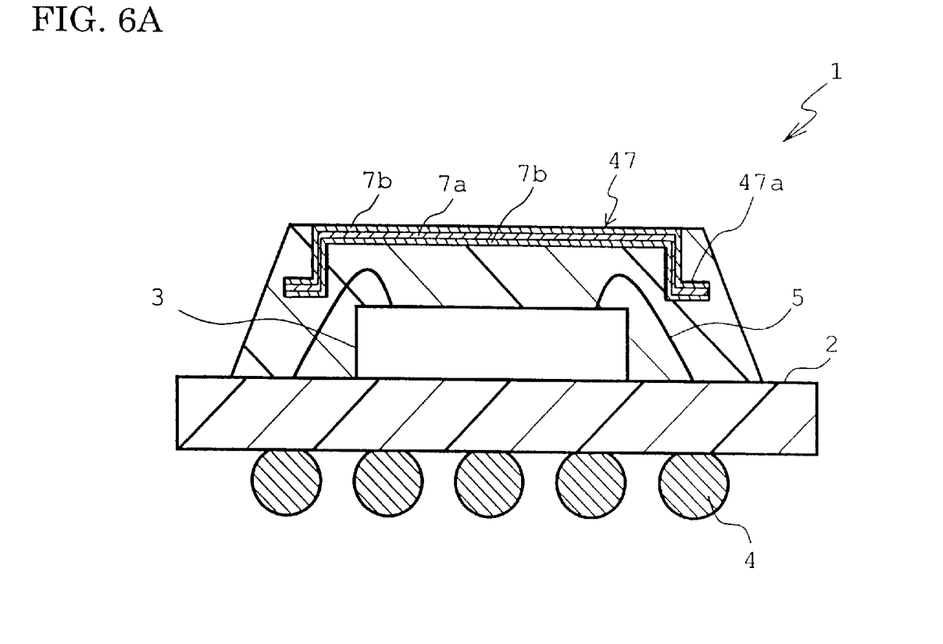
FIG. 6A is a sectional view of the resin sealed ball grid array according to a fifth embodiment of the present invention.
Figure 6B:
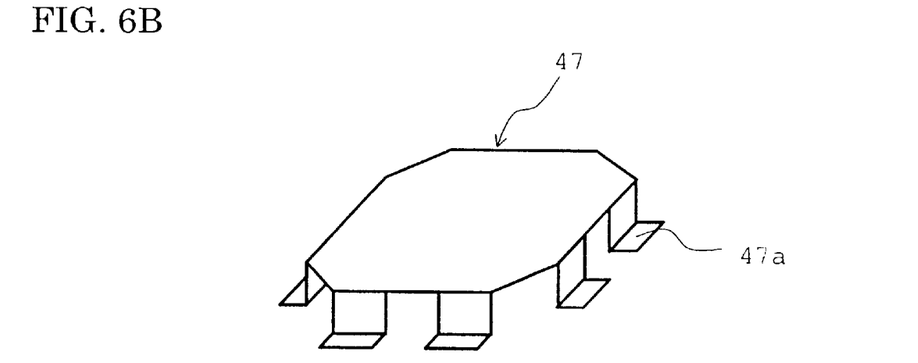
FIG. 6B is a schematic perspective view of the heat radiation member.

FIGS. 6A and 6B show a fifth embodiment of the present invention, wherein FIG. 6A is a sectional view of the BGA 1, and FIG. 6B is a perspective view of the heat radiation member. Incidentally, also in the drawings, the parts similar to those of FIGS. 1A and 1B are denoted with the same reference numerals and the detailed description thereof is omitted.

In the embodiment shown in FIGS. 6A and 6B, leg portions 47a projecting on a sealing resin 6 side are formed on peripheral edges of a heat radiation member 47 comprising the first metal 7a and the second metal 7b. A tip end of the leg portion 47a is, as shown in FIGS. 6A and 6B, formed/bent in parallel to the circuit substrate 2 in order to enhance the adhesive properties to the sealing resin 6.

Since the leg portions 47a projecting on the sealing resin 6 side and having the bent tip ends are buried in the sealing resin 6 in this manner, the adhesive force between the heat radiation member 47 and the sealing resin 6 can be increased.

As described above, in the resin sealed semiconductor device of the present invention, the heat radiation member is constituted as the clad material in which the first metal having a coefficient of linear expansion close to that of the sealing resin is used as the core material, and the second metal having satisfactory adhesive properties to the sealing resin is laminated on the surfaces of the first metal.

Accordingly, there can be obtained the metallic heat radiation member which can satisfy all the three conditions required for the heat radiation member at a satisfactory level, i.e., (1) heat conductivity being excellent, (2) a difference of a coefficient of linear expansion between the heat radiation member and a sealing resin being small, and (3) adhesive properties to the sealing resin being good.

Moreover, in the present invention, the first metal and the second metal can arbitrarily be selected, and there can be provided the heat radiation member suitable for the respective sealing resins different from one another in properties.

Furthermore, in the present invention, since the heat radiation member is constituted as the clad material, the heat radiation member having arbitrary properties can be obtained without increasing any processing cost. The invention is based on Japanese Patent Application No. 2000-340055, which is hereby incorporated by reference. It is to be understood by those skilled in the art that the forgoing description relates to preferred embodiments of the invention and that various changes and modifications may be made in the invention without departing from the spirit and scope thereof. Also it is to be understood that the invention is not limited to the embodiments thereof except as defined in the appended claims.

What is claimed is:

1. A resin sealed semiconductor device comprising:
   a circuit substrate;
   an IC chip mounted on the circuit substrate;
   a sealing resin covering the IC chip and the circuit substrate; and
   a heat radiation member at least partially encapsulated in an upper surface of the sealing resin to be spaced from the IC chip, said heat radiation member being formed of a clad material including a first metal layer having a coefficient of linear expansion close to that of the sealing resin, and a second metal layer made of a material different from that of the first metal layer and fixed to the first metal layer, said second metal layer having a satisfactory adhesive property with the sealing resin and substantially contacting the sealing resin so that the heat radiation member is firmly fixed to the sealing resin and radiates heat therefrom.

2. The resin sealed semiconductor device according to claim 1, wherein said first metal layer of said heat radiation member is copper, and said second metal layer of said heat radiation member is aluminum.

3. The resin sealed semiconductor device according to claim 1, wherein said heat radiation member comprises a three-layer structure in which said second metal layer is laminated on opposite surfaces of said first metal layer.

4. The resin sealed semiconductor device according to claim 1, wherein said heat radiation member comprises a two-layer structure in which said second metal layer is laminated on one surface of said first metal layer.

5. The resin sealed semiconductor device according to claim 1, wherein a color layer having a color same as that of said sealing resin is formed on an upper surface of said heat radiation member.

6. The resin sealed semiconductor device according to claim 1 wherein a protrusion projecting on a side of said IC chip is formed on said heat radiation member.

7. The resin sealed semiconductor device according to claim 1 wherein a funnel-shaped hole portion projecting on a side of said IC chip is formed on said heat radiation member.

8. The resin sealed semiconductor device according to claim 1 wherein a leg portion contacting a ground electrode of said circuit substrate is formed on said heat radiation member.

9. The resin sealed semiconductor device according to claim 1 wherein a leg portion having a bent tip end and buried in said sealing resin is formed on said heat radiation member.

* * * * *